United States Patent [19]
Kitayoshi

[11] Patent Number: 5,748,314
[45] Date of Patent: May 5, 1998

[54] CORRELATION FUNCTION MEASUREMENT METHOD AND APPARATUS, AND WAVE SOURCE IMAGE VISUALIZATION METHOD AND APPARATUS BASED ON CORRELATION FUNCTION MEASUREMENT

[75] Inventor: Hitoshi Kitayoshi, Tokyo, Japan

[73] Assignee: Advantest Corporation, Tokyo, Japan

[21] Appl. No.: 746,293

[22] Filed: Nov. 7, 1996

[30] Foreign Application Priority Data

Nov. 8, 1995 [JP] Japan .................................... 7-289848
Nov. 8, 1995 [JP] Japan .................................... 7-289851

[51] Int. Cl.$^6$ ........................................................ G01B 9/02
[52] U.S. Cl. .......................... 356/346; 356/345; 356/359
[58] Field of Search .................................. 356/345, 346, 356/349, 359, 360

*Primary Examiner*—David C. Nelms
*Assistant Examiner*—Robert Kim
*Attorney, Agent, or Firm*—Oblon, Spivak, McClelland, Maier & Neustadt, P.C.

[57] ABSTRACT

A method for measuring a correlation function wherein correlation function is determined at a high speed without using a fast analog-to-digital convertor. According to the method, a correlation function between a first observation signal and a second observation signal in a predetermined observation frequency band is measured. The first observation signal and the second observation signal are limited to the observation frequency band and converted to a first signal of a first frequency and a second signal of a second frequency by frequency conversion based on a same reference frequency, respectively. A predetermined frequency difference is set between the first frequency and the second frequency. Then the first signal and the second signal are multiplied and a vector detection based on the reference frequency is performed for a difference frequency component between the two signals to obtain the phase information. An apparatus for measuring the correlation function based on the above method is disclosed. Further, a method and an apparatus wherein the correlation function measurement is performed to visualize a wave source image such as a sound source image and a radiowave source image based on the principle of holography is disclosed.

16 Claims, 8 Drawing Sheets

CORRELATION FUNCTION MEASUREMENT METHOD AND APPARATUS, AND WAVE SOURCE IMAGE VISUALIZATION METHOD AND APPARATUS BASED ON CORRELATION FUNCTION MEASUREMENT

BACKGROUND OF THE INVENTION

1. Field of the Invention

The present invention relates to a correlation function measurement method and apparatus of the passive type for performing delay measurement or phase measurement of a signal or various physical amounts. Further, the present invention also relates a method and an apparatus wherein correlation function measurement of the passive type is performed to visualize a wave source image based on the principle of holography.

2. Description of the Prior Art

Methods of measuring a delay time or a phase amount for each frequency in a transmission line as a measurement object are roughly divided into two types including an active type method and a passive type method. The active type method is used in a network analyzer or a like apparatus, and according to the method, a testing signal is generated by the apparatus itself and inputted to the transmission line under the measurement and a transfer function of the transmission line is determined based on an output signal of the transmission line. In the methods of the active type, by differentiating the phase $\Phi(f)$ of the transfer function with the observation frequency f as given by equation (1) below, the delay time $\tau(f)$ of transmission line at the frequency f can be determined readily.

$$\tau(f) = \frac{\Delta \Phi(f)}{\Delta f} \quad (1)$$

On the other hand, in measurement of the passive type, a signal generated by an external signal source is inputted to a transmission line under the measurement. In this instance, since the spectra which can be observed is not necessarily continuous and also the SN (signal to noise) ratio is not fixed but varied by a variation in the external signal source or a like factor, the cross-correlation function $C(\tau)$ is defined like equation (2) below as a function of the delay amount $\tau$, and a delay amount $\tau_m$ at which $C(\tau)$ exhibits a maximum value is determined as a delay time.

$$C(\tau) = \int_{-T/2}^{T/2} a(t)b(t-\tau)dt \quad (2)$$

where a(t) and b(t) are observation signals represented as functions of the time t, and T is a parameter representing a measurement time for correlation determination. As apparently seen from equation (2), $C(\tau)$ can be calculated by hardware using a lock-in amplifier. However, in order to effect the calculation efficiently in a limited frequency band, the construction shown in FIG. 1 is used preferably.

Figure 1:
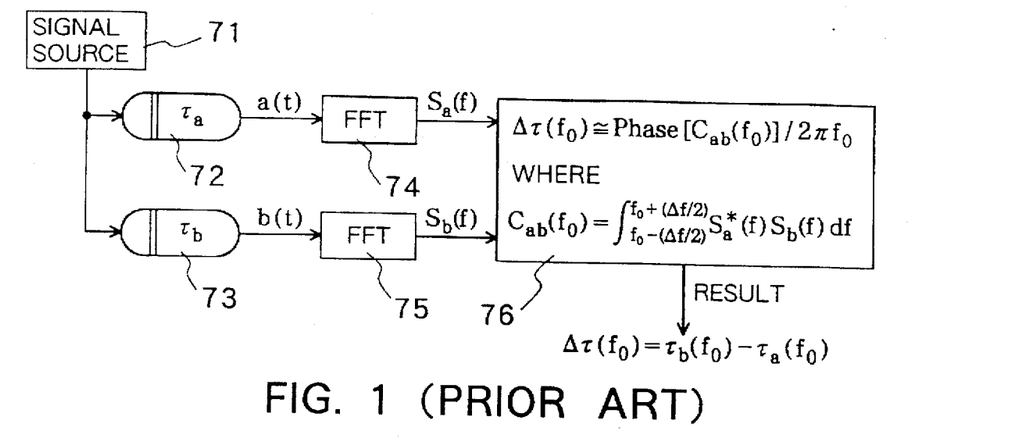
FIG. 1 is a block diagram illustrating conventional delay time measurement of the passive type.

In the construction shown in FIG. 1, it is assumed that a signal from a signal source 71 is inputted to delay elements 72 and 73 whose delay times are represented by $\tau_a$ and $\tau_b$, respectively. Outputs of the delay elements 72 and 73 are represented by the observation signals a(t) and b(t), respectively. Spectra $S_a(f)$ and $S_b(f)$ as functions of the frequency f are calculated by performing FFT (fast Fourier transform) processes 74 and 75 for the observation signals a(t) and b(t), respectively. Then, a correlation function $C_{ab}(f_0)$ given by equation (3) below is calculated by a process 76 where the measurement frequency is represented by $f_0$ and the width of the measurement frequency band is represented by $\Delta f$, and the phase of the correlation function $C_{ab}(f_0)$ is divided by $2\pi f_0$ to obtain an approximate value of $\Delta \tau(f_0)$. The superscript '*' represents a complex conjugate.

$$C_{ab}(f_0) = \int_{f_0 - (\Delta f/2)}^{f_0 + (\Delta f/2)} S_a^*(f)S_b(f)df \quad (3)$$

where $\Delta \tau(f_0)$ is a difference between the delay times $\tau_a(f_0)$ and $\tau_b(f_0)$ of the two delay elements 72 and 73 at the observation frequency $f_0$. Accordingly, by detecting and substituting an input signal to the transmission line into a(t) and substituting an output signal of the transmission line into b(t), the delay time of the measurement object transmission line is determined as $\Delta \tau(f_0)$.

However, the measurement of the passive type described above has problems in that, since frequency spectra of the observation signals a(t) and b(t) must be determined, analog-to-digital converters which operate at a high speed and with a high degree of accuracy are required and in that, since a large number of calculations of numerical values such as FFT calculation or numerical integration of equation (3) given above must be performed, an analysis on the real time basis is difficult.

By the way, as one of applications of correlation function measurement of the passive type, there is visualization of a wave source image which makes use of the principle of a hologram. In the following, a technique for visualization of a wave source image is described.

The technique of visualizing a wave source image using a radiowave hologram or a sound wave hologram has been put into practical use. For example, the technique is used for reduction of unnecessary electromagnetic radiations or reduction of noise. By obtaining and analyzing a radio wave hologram of a body of an object of measurement, it can be known from which portion of the body what amount of unnecessary radiations is produced, visualization of a radiation source distribution is performed, and information which is effective to take a so-called EMI (Electromagnetic Interference) counter-measure can be obtained. Since sound waves and radiowaves are not different from light in that they are waves, a hologram image can be obtained by the same principle as is used where a laser beam is used for obtaining an optical hologram. Visualization of a sound source distribution by sound wave holography is disclosed, for example, in Sadayuki Ueha, "Sound Wave Holography and Search for Noise Source", KEISOKU TO SEIGYO (Measurement and Control), Vol. 16, No. 5, 1977, pp.427–433. However, since radio waves and sound waves are very long in wavelength comparing with light, a fixed sensor and a scanning sensor are used for obtaining the data, and the scanning sensor is scanned two-dimensionally in a measurement plane and a hologram image is reconstructed by calculation processing.

Figure 2:
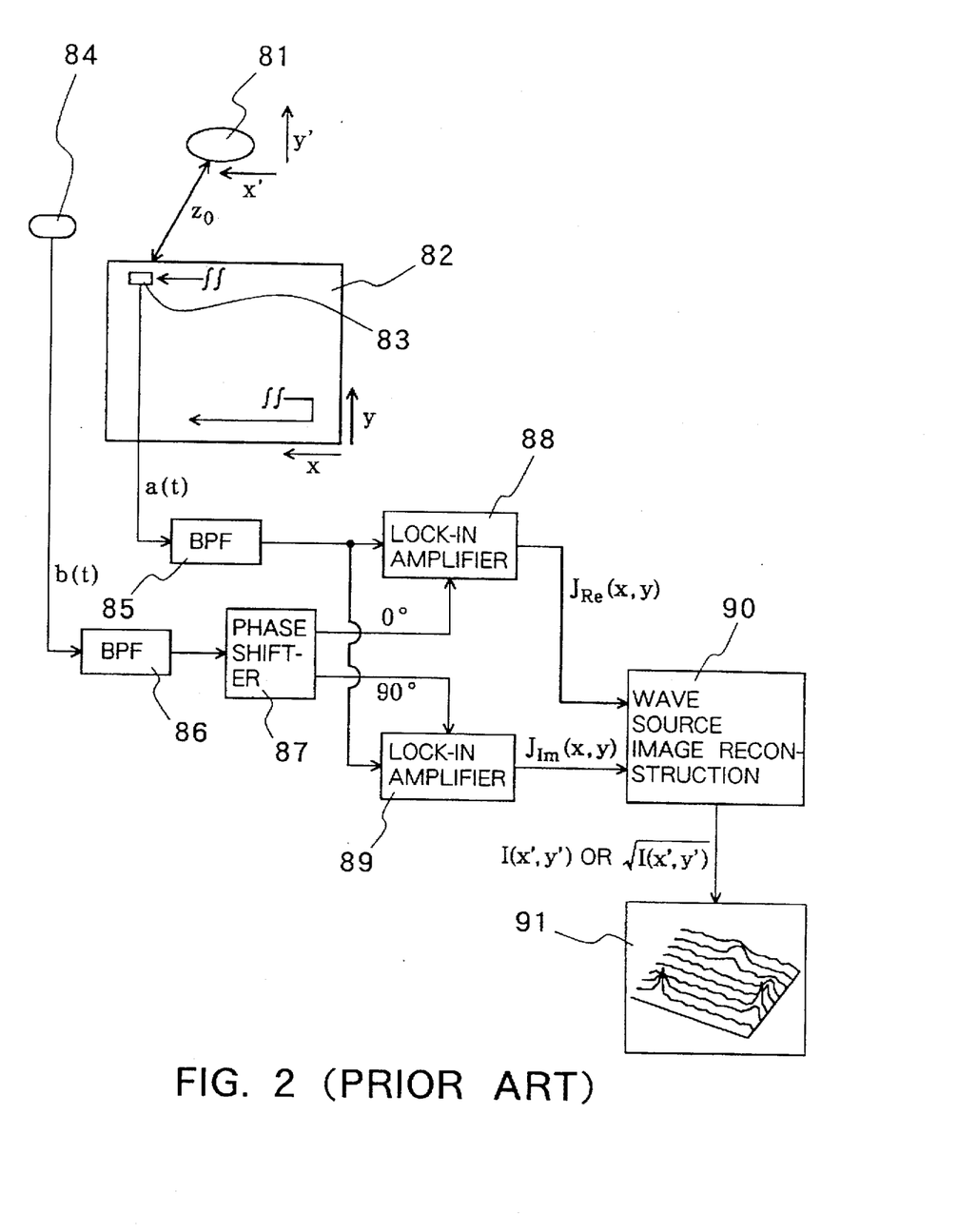
FIG. 2 is a block diagram showing a construction of a conventional apparatus for visualization of a wave source image.

FIG. 2 is a block diagram showing a construction of a conventional apparatus for visualization of a wave source image wherein two-dimensional interference measurement is performed to obtain a two-dimensional complex interferogram (complex hologram) and this interferogram is reconstructed to display a wave source distribution. The apparatus is disclosed in the reference document mentioned above.

A scanning observation plane 82 is set at a location spaced by a distance $z_0$ from an observation object 81, and using a scanning sensor 83 which travels in the scanning observation plane 82, a radiowave or a sound wave from the observation object 81 is detected to obtain a signal b(t) at various points of the scanning observation plane 82. Further, a fixed sensor 84 is provided separately from the scanning sensor 83, and a radiowave or a sound wave from the observation object 81 is detected also by the fixed sensor 84 to obtain another signal a(t). Here, x and y are two-dimensional coordinate values in the scanning observation plane 82, and x' and y' are two-dimensional coordinate values of the observation object 81.

The signals b(t) and a(t) from the sensors 83 and 84 are restricted to a predetermined frequency band by band-pass filters 85 and 86, respectively. The signal b(t) is inputted to lock-in amplifiers 88 and 89 while the signal a(t) is inputted to a phase shifter 87. From the phase shifter 87, a signal having no phase delay (0 degrees) is outputted as a reference signal for the lock-in amplifier 88, and another signal having delay of $\pi/2$ (90 degrees) in phase is outputted as a reference signal for the other lock-in amplifier 89. Accordingly, from the lock-in amplifier 88, a real component $J_{Re}(x, y)$ of a complex correlation value at a point (x, y) on the scanning observation plane 82 is outputted, and from the other lock-in amplifier 89, an imaginary component $J_{Im}(x, y)$ of the correlation value at the point (x, y) is outputted. A two-dimensional complex interferogram is obtained by observing correlation values at various points of the scanning observation plane 82. Here, since the frequency band is limited by the band-pass filters 85 and 86 and the lock-in amplifiers 88 and 89 are used, it is considered that a process equivalent to calculation of the correlation function $C_{ab}(f_0)$ based on equation (3) above in the frequency band limited by the band-pass filters 85 and 86 has been performed.

Based on the correlation values at the various points obtained in such a manner as described above, a wave source image is reconstructed by a wave source image reconstruction processing unit 90, and the wave source image is displayed on a display unit 91. More particularly, if the intensity of radiations at a point (x', y') on the observation object 81 is represented by I(x', y'), then the intensity I(x', y') can be represented in the following manner. An imaginary unit is represented as j.

$$I(x',y') = \left| \iint \frac{(J_{Re}(x,y) + jJ_{Re}(x,y))\exp(-jk_0 r)}{r} dxdy \right|^2 \quad (4)$$

where $$k_0 = 2\pi/\lambda_0 \quad (5)$$

$$r = \sqrt{z_0^2 + (x-x')^2 + (y-y')^2} \quad (6)$$

The wave source image reconstruction processing unit 90 performs calculation represented by equation (4) above.

By the way, the right side member of equation (4) represents the amplitude where the wave source is coherent, but represents a square of the amplitude where the wave source is incoherent. Accordingly, when the display unit 91 displays an amplitude distribution of the observation object 81, where the wave source is coherent, I(x', y') must be outputted to the display unit 91, but where the wave source is incoherent, $\sqrt{I(x',y')}$ must be outputted to the display unit 91.

The conventional apparatus for visualization of a wave source image described above has a problem in that it cannot sufficiently follow up a fast spectrum variation due to the limitation in responsibility of its lock-in amplifier. Further, the interpretation of a reconstructed image is different depending upon whether the wave source is coherent or incoherent, and if it is not known in advance whether the wave source is a coherent wave source or an incoherent wave source, the reconstructed image cannot sometimes be interpreted. Since, in visualization of unnecessary radiations from an electronic apparatus, coherent, incoherent and partially coherent components are present in a mixed state temporally and spatially and besides it is difficult in most cases to predict a ratio among them in advance, after all it is difficult to effect quantitative interpretation with the conventional apparatus. Further, the conventional apparatus has an additional problem in that, since only an intensity distribution is detected, temporal and spatial coherencies of a wave source state cannot be evaluated.

SUMMARY OF THE INVENTION

It is a first object of the present invention to provide a correlation function measurement method wherein a correlation function can be determined at a high speed with a high degree of accuracy and a delay time $\Delta\tau$ can be determined without the necessity for an analog-to-digital converter which operates at a high speed particularly where the delay time $\Delta\tau$ is smaller than the frequency band $\Delta f$ for observation ($\Delta\tau < 1/\Delta f$).

It is a second object of the present invention to provide a correlation function measurement apparatus wherein a correlation function can be determined at a high speed with a high degree of accuracy and a delay time $\Delta\tau$ can be determined without the necessity for a digital-to-analog converter which operates at a high speed particularly where the delay time $\Delta\tau$ is smaller than the frequency band $\Delta f$ for observation ($\Delta\tau < 1/\Delta f$).

It is a third object of the present invention to provide a wave source visualization method which allows evaluation of a distribution of a partially coherent wave source without the necessity for beforehand knowledge of a coherency and allows following up to a rapid variation of a spectrum.

It is a fourth object of the present invention to provide a wave source visualization apparatus which allows evaluation of a distribution of a partially coherent wave source without the necessity for beforehand knowledge of a coherency and allows following up to a rapid variation of a spectrum.

The first object of the present invention is achieved by a correlation function measurement method for measuring a correlation function between a first observation signal and a second observation signal in a predetermined observation frequency band, comprising the steps of: limiting the first observation signal to the observation frequency band to perform a frequency conversion of the first observation signal into a signal of a first frequency; limiting the second observation signal to the observation frequency band to perform a frequency conversion of the second observation signal, based on a reference frequency signal same as that used upon the frequency conversion to the first frequency, to a signal of a second frequency having a predetermined frequency difference from the first frequency; and multiplying the signal of the first frequency and the signal of the second frequency and performing vector detection, based on the reference frequency signal, for a difference frequency component between the two signals.

In the correlation function measurement method of the present invention, instead of performing calculation based on equation (3) above, a first observation signal and a second observation signal are band limited to a predetermined observation frequency band and vector detection is performed for a difference frequency component in results of multiplication between the signals to obtain information regarding a correlation function. In this instance, due to the facts that, if the two signals limited to the observation frequency band are multiplied as they are, difference frequency components almost become a dc component and that a signal in the observation frequency band is excessively high for multiplication, frequency conversion is performed so that a predetermined frequency difference may be produced between the first observation signal and the second observation signal after the band limitation. Further, the first observation signal and the second observation signal may not be converted directly into signals of the frequency to be inputted to a multiplier, but may be applied to the multiplier after they are converted into signals of a same intermediate frequency and then frequency conversion is performed again for the resulting signals. Since measurement of a correlation function must maintain phase information, particularly, for example, a local oscillator must be phase locked to a reference frequency signal so that frequency conversion or vector detection may be performed based on the same reference frequency signal.

In the correlation function measurement method of the present invention, as a method of the vector detection, a method based on synthesized Fourier integration (SFI) wherein a reference signal corresponding to the difference frequency mentioned above is generated based on the reference frequency signal to effect vector detection is preferably used. Further, in order to perform delay time measurement of the passive type, using an output signal and an input signal of a transmission line under a measurement as the first observation signal and the second observation signal, respectively, phase information $P(f_0)$ obtained by the vector detection may be divided by an observation angular frequency $2\pi f_0$.

The second object of the present invention is achieved by a correlation function measurement apparatus for measuring a correlation function between a first observation signal and a second observation signal in a predetermined observation frequency band, comprising: first conversion means for limiting the first observation signal to the observation frequency band and performing a frequency conversion of the first observation signal into a signal of a predetermined intermediate frequency; second conversion means for limiting the second observation signal to the observation frequency band and performing a frequency conversion of the second observation signal to a signal of the intermediate frequency based on a reference frequency signal same as that used by the first conversion means; a multiplier for multiplying the signal supplied from the first conversion means and the signal supplied from the second conversion means; a mixer interposed between an output of at least one of the first conversion means and the second conversion means, and the multiplier; a local oscillator provided for each mixer for supplying a local oscillation signal phase-locked to the reference frequency signal to the mixer so that a predetermined frequency difference may be produced between the two signals to be inputted to the multiplier; and a vector detector for performing vector detection for a difference frequency component of the output of the multiplier based on the reference frequency signal.

The third object of the present invention is achieved by a wave source image visualization method wherein two-dimensional interference measurement is performed for a radiation wave from an observation object to visualize a wave source image of the observation object, comprising the steps of: detecting the radiation wave at a position which makes a reference to an observation plane of the two-dimensional interference measurement to output a first signal; detecting the radiation wave at an arbitrary position in the observation plane to output a second signal; performing Fourier transform of the first signal and the second signal to obtain a first spectrum and a second spectrum, respectively; detecting a power spectrum of the first spectrum, a power spectrum of the second spectrum and a cross-spectrum between the first spectrum and the second spectrum; determining a coherence function based on an average value of the cross-spectrum and average values calculated from the power spectra; obtaining the cross-spectrum for each point in the observation plane, normalizing the cross-spectrum with a square root of the power spectrum of the first spectrum and performing integration calculation for the normalized cross-spectrum in accordance with a value of the coherence function in an observation frequency band to calculate a correlation value; and selecting an operation processing method for reconstruction of the wave source image in accordance with a distance between the observation object and the observation plane and reconstructing the wave source image based on the correlation value at each of the points.

In the wave source image visualization method of the present invention, an arbitrary wave which can be measured by two-dimensional interference measurement such as a sound wave or a radiowave can be used as a radiation wave. In order to detect a wave source image of a radiowave of a microwave band, Fourier transform may be performed after a received signal is converted in frequency into a signal of an intermediate frequency band.

In the wave source image visualization method of the present invention, integration calculation is performed upon calculation of a cross-correlation value, for example, within a frequency range in which the value of the coherence function is higher than a predetermined threshold value. Further, for the calculation processing method for reconstruction of a wave source image, for example, a method which corresponds to a neighborhood field region in wave interference, another method which corresponds to a Fresnel region, a further method which corresponds to a Fraunhofer region, and so forth are prepared.

According to the present invention, phase information and amplitude information of a reconstructed wave source image can be displayed simultaneously. In this instance, temporal and spatial coherencies can be evaluated by performing measurement in different trigger conditions and comparing phase information and amplitude information with each other.

The fourth object of the present invention is achieved by a wave source image visualization apparatus wherein two-dimensional interference measurement is performed for a radiation wave from an observation object to visualize a wave source image of the observation object, comprising: a first sensor for detecting the radiation wave at a position which makes a reference to an observation plane of the two-dimensional interference measurement and outputting the detected radiation wave as a first signal; a second sensor for detecting the radiation wave at an arbitrary position in the observation plane and outputting the detected radiation wave as a second signal; Fourier transform means for performing Fourier transform of the first signal and the second signal to calculate a first spectrum and a second spectrum, respectively; average value calculation means for calculating an average value of a power spectrum of the first spectrum, an average value of a power spectrum of the second spectrum and an average value of a cross-spectrum between the first spectrum and the second spectrum; coherence function calculation means for determining a coherence function based on the average value of the cross-spectrum and the average values calculated from the power spectra; correlation value calculation means for obtaining the cross-spectrum for each point in the observation plane, normalizing the cross-spectrum with a square root of the power spectrum of the first spectrum and performing integration calculation for the normalized cross-spectrum in accordance with a value of the coherence function in an observation frequency band to calculate a correlation value; and wave source image reconstruction processing means for selecting operation processing for reconstruction of the wave source image in accordance with a distance between the observation object and the observation plane and reconstructing the wave source image based on the correlation value at each of the points.

The above and other objects, features and advantages of the present invention will become apparent from the following description referring to the accompanying drawings which illustrate example of preferred embodiments of the present invention.

DESCRIPTION OF THE PREFERRED EMBODIMENTS

First Embodiment

Figure 3A:
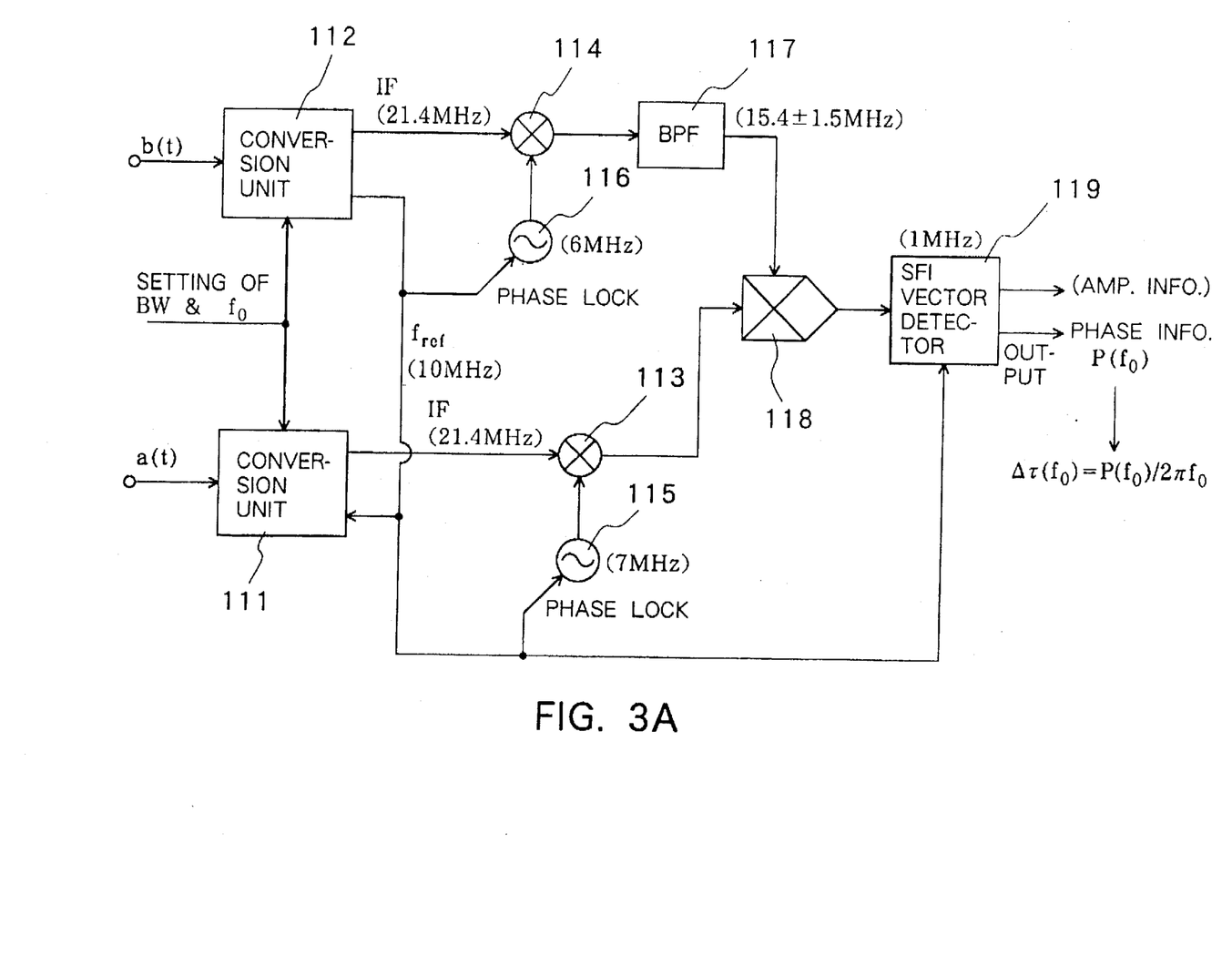
FIG. 3A is a block diagram showing a construction of a correlation function measurement apparatus according to a first embodiment of the present invention.

A correlation function measurement apparatus shown in FIG. 3 is designed to measure, based on a correlation function measurement method of the present invention, a correlation between two observation signals a(t) and b(t), typically a delay time $\Delta\tau(f_0)$ between both observation signals in an observation frequency band whose center frequency is $f_0$ and whose bandwidth is BW. While frequency values are shown in respective parentheses in FIG. 3, those frequency values are mere example values, and the present invention is not limited to a specific application in which those frequencies are used.

The correlation function measurement apparatus includes conversion units 111 and 112 for limiting the observation signals a(t) and b(t) in bandwidth so that they have the center frequency $f_0$ and the bandwidth BW and converting the band limited signals in frequency to signals having an intermediate frequency IF (here, 21.4 MHz).

Figure 3B:
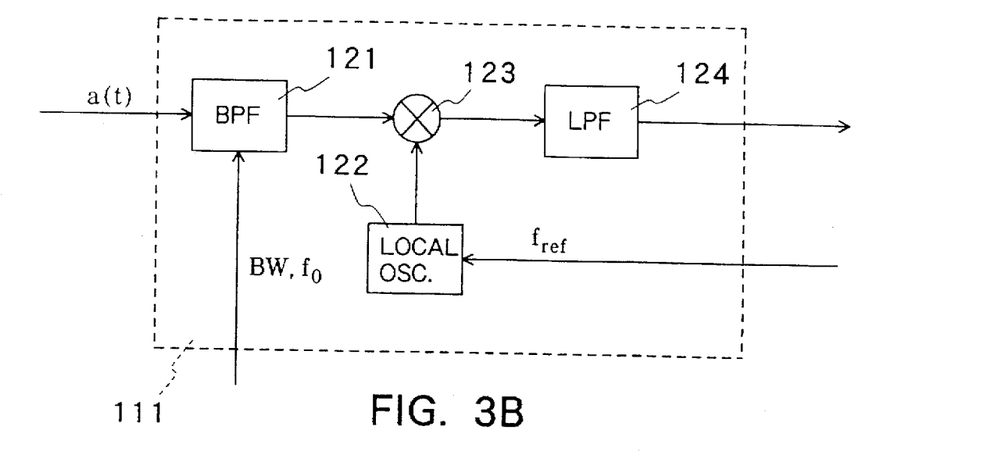
FIG. 3B is a block diagram showing an example of a construction of a conversion unit without a reference oscillator.
Figure 3C:
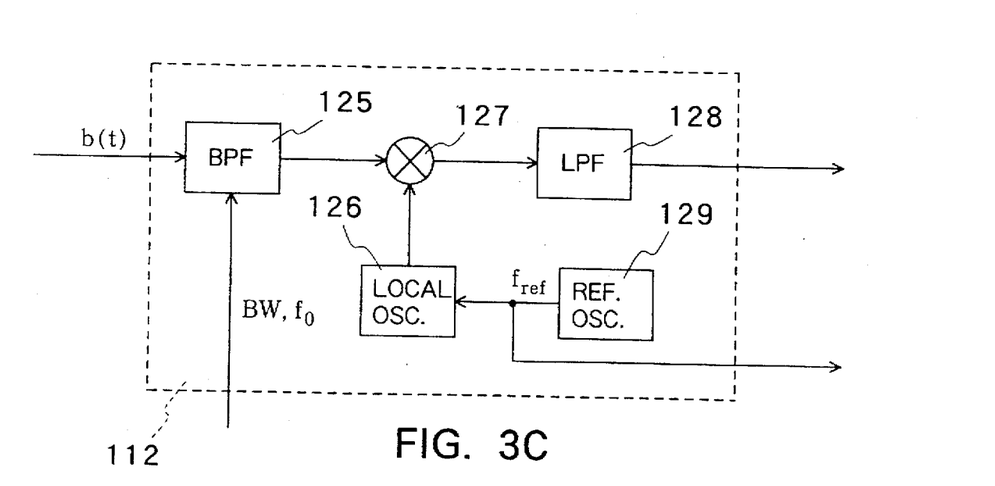
FIG. 3c is a block diagram showing an example of a construction of a conversion unit having a reference oscillator.

FIGS. 3B and 3C show examples of the constructions of the conversion units 111 and 112, respectively. The conversion unit 111 to which the observation signal a(t) is inputted has a band-pass filter 121 for limiting the frequency band of the signal a(t), a built-in local oscillator 122, a mixer 123 which receives outputs of the band-pass filter 121 and the local oscillator 122 and performs frequency conversion of the signal a(t), and a low-pass filter 124 disposed at the output of the mixer 123. Similarly, the conversion unit 112 to which the observation signal b(t) is inputted has a band-pass filter 125 for limiting the frequency band of the signal b(t), a built-in local oscillator 126, a mixer 127 which receives outputs of the band-pass filter 125 and the local oscillator 126 and performs frequency conversion of the signal b(t), and a low-pass filter 128 disposed at the output of the mixer 127. Further, the conversion unit 112 has a built-in reference oscillator 129 which oscillates and outputs a reference frequency signal $f_{ref}$ (here, 10 MHz). Each of the local oscillators 122 and 126 provided in the conversion units 111 and 112 is constructed so as to operate in a phase-locked relationship with the reference frequency signal $f_{ref}$. The center frequency $f_0$ and the bandwidth BW of each of the band-pass filter 121 and 125 is arbitrarily adjustable based on external settings.

The range of the observation center frequency $f_0$ is, for example, 0 Hz to 26.5 GHz, and the bandwidth BW is, for example, 10 Hz to 3 MHz. The conversion units 111 and 112 are each realized by causing, for example, an RF spectrum analyzer to operate in a zero span mode.

Mixers 113 and 114 are provided on the output sides of the conversion units 111 and 112, respectively, and local oscillators 115 and 116 phase-locked to the reference frequency signal $f_{ref}$ are connected to the mixers 113 and 114, respectively. Here, the oscillation frequency of the local oscillator 115 is 7 MHz and the oscillation frequency of the local oscillator 116 is 6 MHz so that they have a frequency difference $f_d$ of 1 MHz. Consequently, the observation signal a(t) is converted into a signal of 14.4±1.5 MHz by the mixer 113 whereas the observation signal b(t) is converted into a signal of 15.4±1.5 MHz by the mixer 114. A band-pass filter 117 of 15.4±1.5 MHz is provided on the output side of the mixer 114 so that an image frequency may be removed by it.

The output of the band-pass filter 117 and the output of the mixer 113 are inputted to a multiplier 118, by which the observation signal a(t) after conversion into a signal of 14.4±1.5 MHz and the observation signal b(t) after conversion into a signal of 15.4±1.5 MHz are multiplied. A result of the multiplication is inputted to an SFI (Synthesized Fourier Integration) vector detector 119. The SFI vector detector 119 performs a vector detection of a component of the difference frequency $f_d$ of the result of the multiplication using the reference frequency signal as a reference signal, and outputs amplitude information and phase information $P(f_0)$. The delay time $\Delta\tau(f_0)$ between the observation signals a(t) and b(t) is given by $$\Delta\tau(f_0) = \frac{\Delta P(f_0)}{2\pi f_0} \quad (7)$$

While, in the apparatus described above, no band-pass filter is provided in the path of the observation signal a(t), this is because signals of 43.8 MHz and 13 MHz which are results of the multiplication of the image frequency (28.4 MHz) of the observation signals a(t) and the observation signal b(t) are removed by the SFI vector detector 119.

Figure 4A:
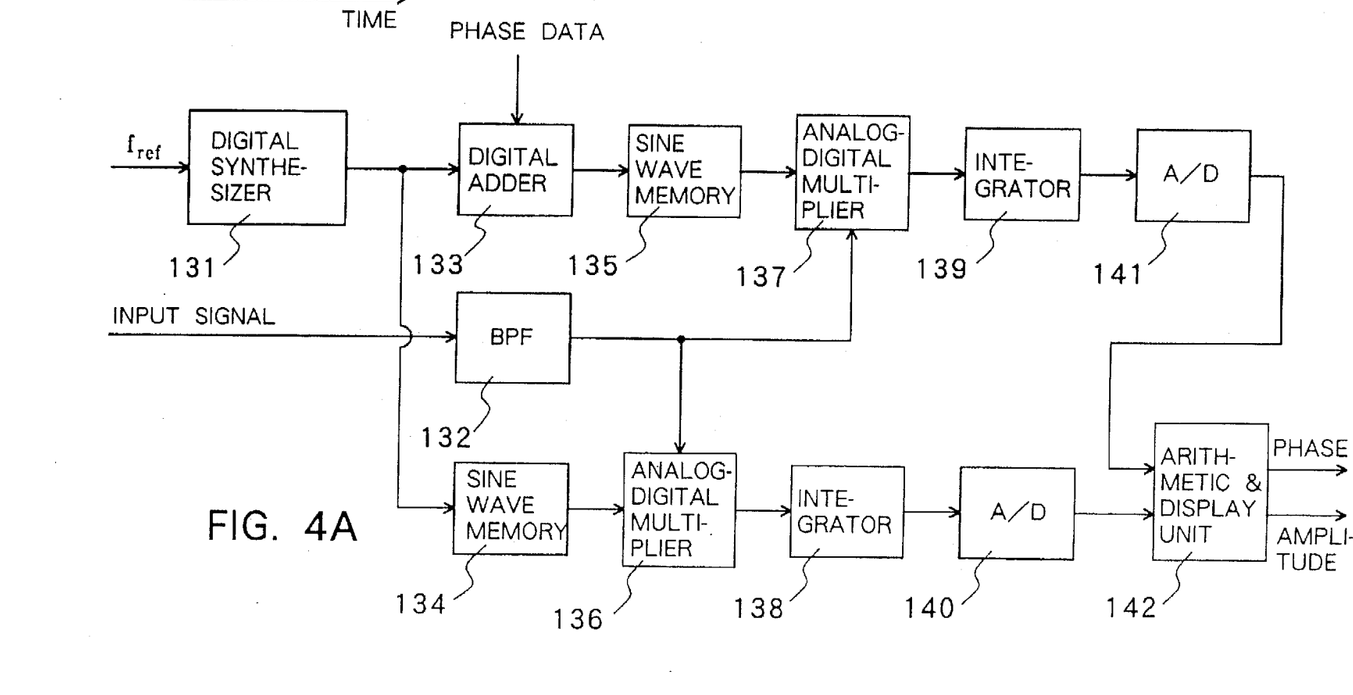
FIG. 4A is a block diagram showing a construction of an SFI (Synthesized Fourier Integration) vector detector.

Subsequently, a construction of the SFI vector detector 119 will be described with reference to FIG. 4A. The SFI vector detector 119 effects vector detection of an input signal by synthesized Fourier integration.

Figure 4B:
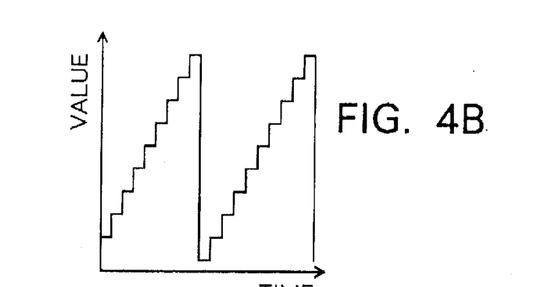
FIG. 4B is a graph illustrating a variation of the output of a digital sensitizer.

A digital synthesizer 131 to which the reference frequency signal $f_{ref}$ is inputted is provided in the inside of the SFI vector detector 119 and produces a digital signal whose value varies stepwise with respect to time in response to the reference frequency signal $f_{ref}$ as seen in FIG. 4B. The digital signal is inputted to a sine wave memory 134 and is inputted to the other sine wave memory 135 via a digital adder 133. The digital adder 133 adds phase data corresponding to a phase advance amount. The sine wave memories 134 and 135 store instantaneous values of a sine wave for each unit time obtained by equally dividing one period of the sine wave as digital data. When a digital signal whose value varies in synchronism with a clock signal with a fixed increment is applied to the sine wave memories 134 and 135, each of the sine wave memories 134 and 135 outputs a digital signal whose value varies in conformity with a sine wave.

Analog-digital multipliers 136 and 137 which multiply a digital signal and an analog signal are provided on the output sides of the sine wave memories 134 and 135 so that the outputs of the sine wave memories 134 and 135 are inputted as digital signals to the analog-digital multipliers 136 and 137, respectively. On the other hand, the input signal to the SFI vector detector 119 in the form of an analog signal is supplied to analog side input terminals of the analog-digital multipliers 136 and 137 via a band-pass filter 132. The outputs of the analog-digital multipliers 136 and 137 are inputted to analog to digital converters 140 and 141 via integrators 138 and 139, respectively. Then, the outputs of the analog to digital converters 140 and 141 are both inputted to an arithmetic and display unit 142. The arithmetic and display unit 142 calculates a vector detection result and outputs phase and amplitude information.

After all, in the SFI vector detector 119, sine waves of an arbitrary frequency which are locked in phase with the reference frequency signal $f_{ref}$ can be generated as a reference signal for the SFI vector detector 119 by using the digital synthesizer 131 and the sine wave memories 134 and 135. And, the sine wave signals (reference signals) of a predetermined frequency (in the example described above, 1 MHz) synthesized from the reference frequency signal $f_{ref}$ and the input signal are multiplied by the analog-digital multipliers 136 and 137, and results of the multiplication are integrated by the integrators 138 and 139, respectively. Accordingly, if the phase data to be added by the digital adder 133 is set to a value corresponding to the phase shift amount π/2, then a cosine component and a sine component are extracted from a component of the input signal whose frequency is 1 MHz. Consequently, vector detection is realized.

In the correlation function measurement method of the present invention, after band limitation in accordance with an observation frequency band is performed for the two observation signals a(t) and b(t), they are multiplied after frequency conversions in which a predetermined frequency difference between them may be produced is performed, and vector detection is performed for a result of the multiplication. Consequently, a delay time and so forth of a transmission line as a measurement object can be calculated on the real time basis without the necessity for an analog-to-digital converter which operates at a high speed and without the necessity for complicated numerical calculation.

Figure 5:
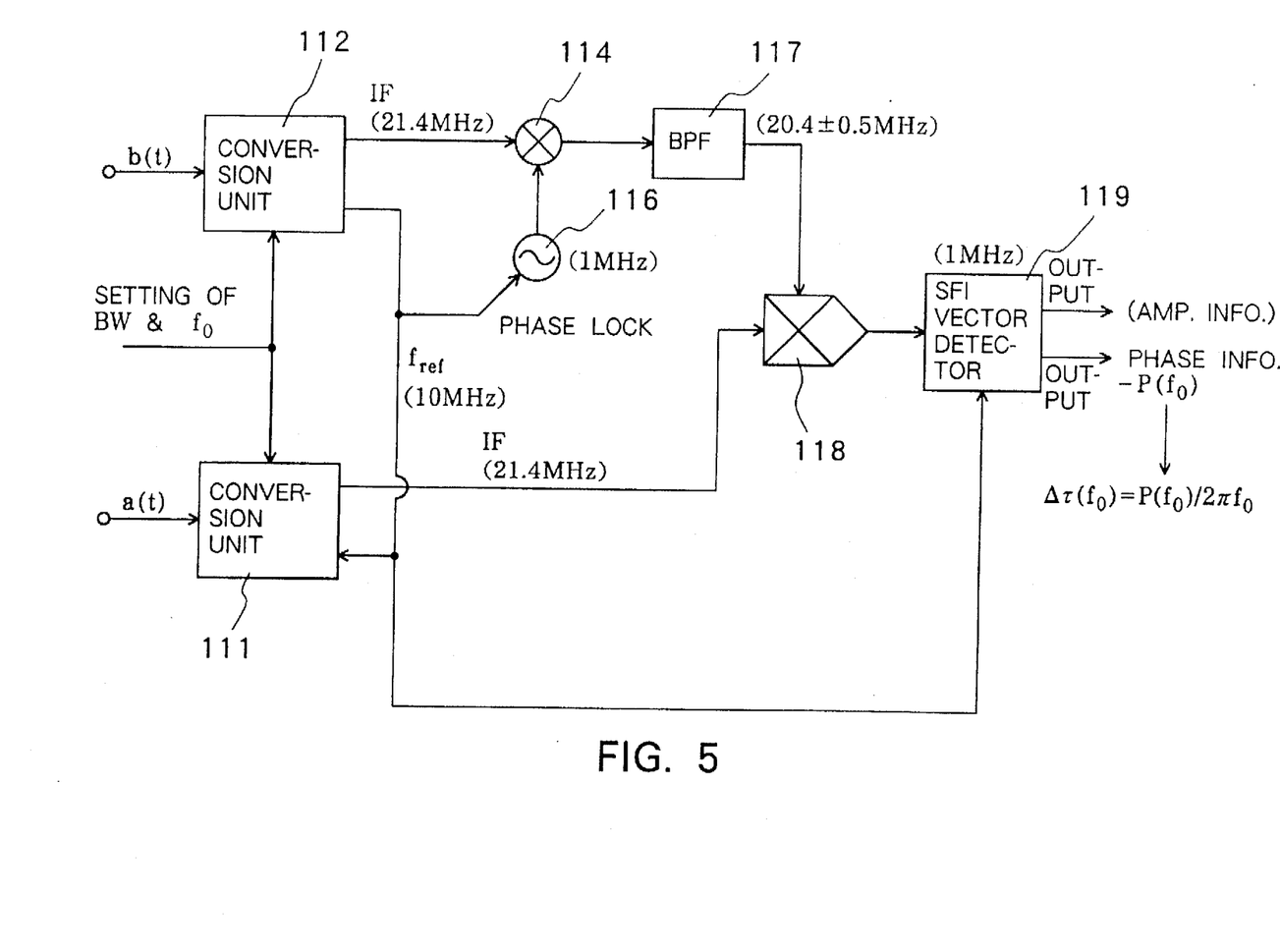
FIG. 5 is a block diagram showing a construction of a correlation function measurement apparatus according to a second embodiment of the present invention.

Second Embodiment

Where the bandwidth BW of the observation frequency is sufficiently narrower than the frequency (1 MHz) for vector detection, it is possible to omit the mixer 113 and the local oscillator 115 corresponding to the observation signal a(t) in the first embodiment. FIG. 5 shows a construction of a correlation function measurement apparatus of a second embodiment of the present invention which omits the mixer and the local oscillator of the observation signal a(t) side in this manner. Here, the oscillation frequency of the local oscillator 116 on the observation signal b(t) side is 1 MHz, and the observation signal b(t) whose frequency has been converted into 20.4 MHz and the observation signal a(t) whose frequency has been converted into an intermediate frequency IF (21.4 MHz) are inputted to the multiplier 118.

Example of Measurement Using the Correlation Function Measurement Apparatus

Figure 6:
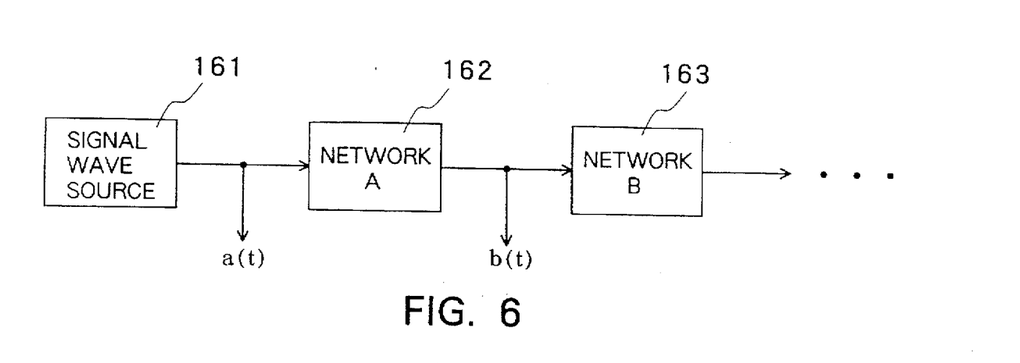
FIG. 6 is a block diagram illustrating an example of measurement using the correlation function measurement apparatus according to the present invention.

Subsequently, an example of measurement which uses the correlation function measurement apparatus described above will be described. In an example shown in FIG. 6, a network A 162, another network B 163, . . . are connected in series to a signal wave source 161. An input signal to the network A 162, that is, an output signal of the signal wave source 161, is extracted as an observation signal a(t) and an output signal of the network A 162 is extracted as another observation signal b(t) to measure an operation state or a delay characteristic of the network A 162. In this instance, the signal inputted from the signal wave source 161 to the network A 162 or the output signal of the network A 162 need not be an electric signal, but may be a signal measured by a sensor of any type and represented in a physical amount such as, for example, a temperature, a flow rate, a sound pressure or a displacement amount, and the observation signals a(t) and b(t) may be represented in different physical amounts. Also in those cases, a propagation velocity, a flow amount per unit time, a propagation distance and so forth can be calculated, for example, from the delay time $\Delta\tau(f_0)$. In this manner, measurement of an operation state can be performed by extracting an observation signal from an arbitrary point of a network or a transmission line.

Figure 7:
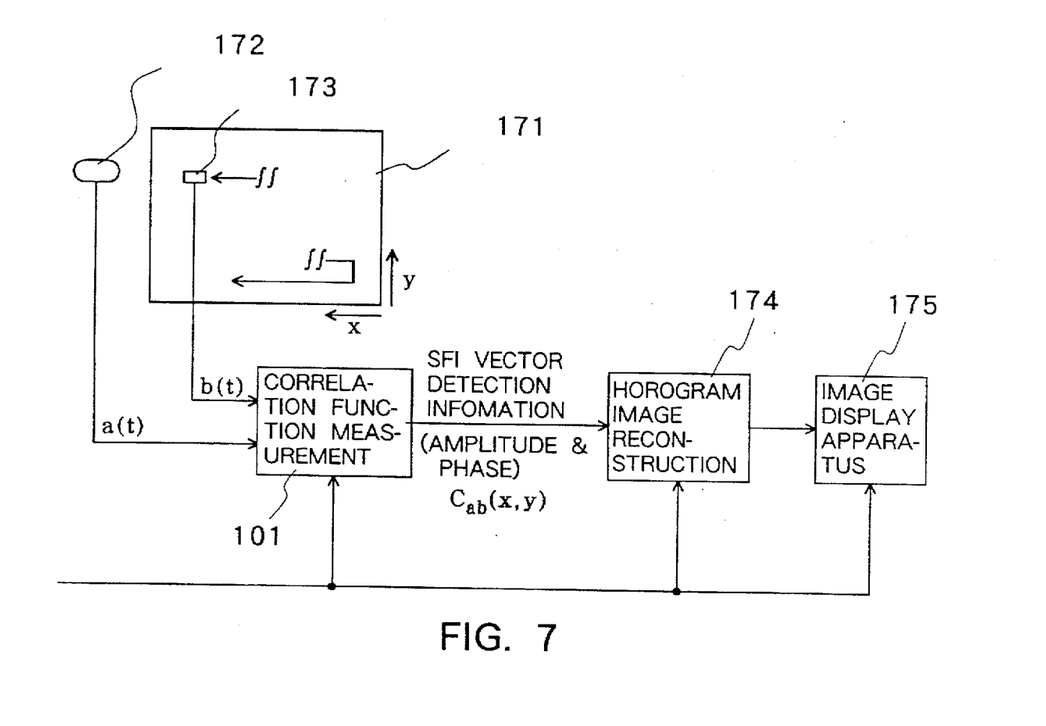
FIG. 7 is a block diagram showing an example of an arrangement wherein a hologram image is reconstructed using the correlation function measurement apparatus according to the invention.

FIG. 7 shows a wave interferometer wherein the correlation function measurement apparatus described above is used as a complex correlator to effect recording and reconstruction of a hologram image. Here, a fixed sensor 172 and a scanning sensor 173 are prepared, and the scanning sensor 173 is scanned two-dimensionally in xy directions in a hologram observation plane 171 to obtain data, and a hologram image is reconstructed by calculation processing. In particular, using a signal from the fixed sensor 172 as the observation signal a(t) and using a signal from the scanning sensor 173 as the observation signal b(t), SFI vector detection information (amplitude and phase) $C_{ab}(x, y)$ at different points (x, y) on the hologram observation plane 171 is measured using a correlation function measurement apparatus 101 described above. And, based on the amplitude information and phase information thus measured, a hologram image should be reconstructed by a hologram image reconstruction apparatus 174 and displayed on an image display apparatus 175. An extent and so forth of the wave source can be discriminated from the hologram image.

It is to be noted that, by making the observation center frequency $f_0$ and the bandwidth BW variable and comparing wave source reconstruction images (hologram images) obtained with the varied values of them with each other, a distance between the wave source and the hologram observation plane, a characteristic of the wave source and so forth can be discriminated in detail. The distance from the hologram observation plane to the wave source can be obtained by differentiating the phase of the reconstructed wave source image with the observation center frequency $f_0$. A cross-correlation between wave sources can be discriminated by comparing reconstruction images obtained by varying the observation center frequency $f_0$ and the bandwidth BW with each other and making use of the differences in amplitude distribution and phase distribution.

Third Embodiment

Figure 8:
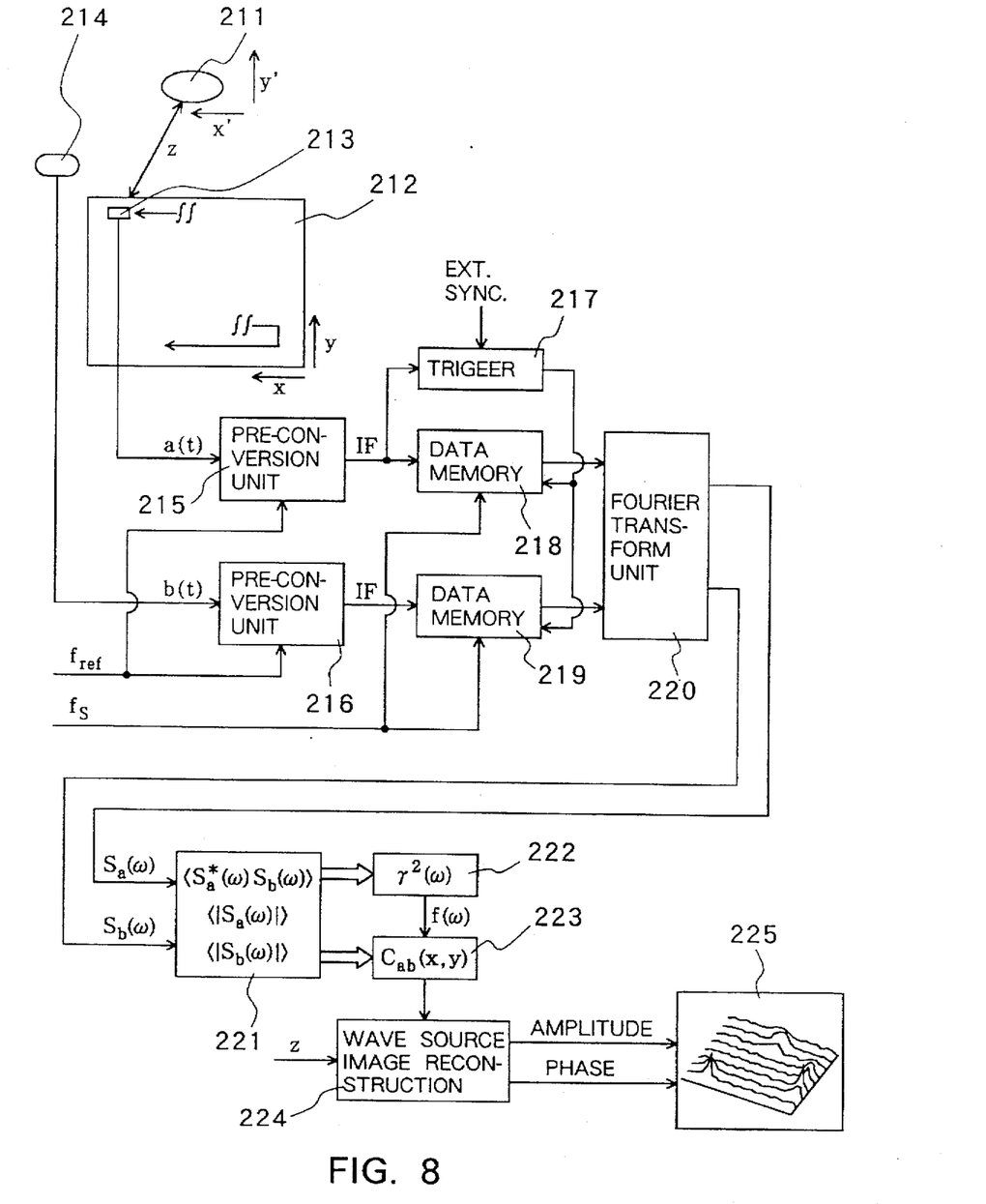
FIG. 8 is a block diagram showing a construction of a wave source visualization apparatus according to a third embodiment of the present invention.

A wave source visualization apparatus shown in FIG. 8 displays a wave source image of an object of observation based on the wave source image visualization method of the present invention.

A scanning observation plane 212 is provided at a location spaced by a distance z from an observation object 211 having a plurality of or an aggregate of wave sources, and a scanning sensor 213 is disposed so that it moves in the scanning observation plane 212. Further, a fixed sensor 214 which does not move is disposed separately from the scanning sensor 213. The scanning sensor 213 corresponds to the second sensor while the fixed sensor 214 corresponds to the first sensor. The scanning sensor 213 and the fixed sensor 214 are, for example, where the observation wave is a sound wave, microphones, but where the observation wave is a radiowave, antennae. In the following description, the two-dimensional coordinate values on the scanning observation plane 212 are represented by x, y, and the two-dimensional coordinate values on the observation object 211 are represented by x', y'. Further, in the wave source visualization method of the present invention, it is presumed that the distance r between the observation object 211 and the scanning sensor 213, or between the observation object 211 and the fixed sensor 214 is sufficiently small comparing with the bandwidth $\Delta\omega$ of a visualized spectrum, which is a bandwidth by an angular frequency representation of the observation frequency band, that is, $r<<v/\Delta\omega$, where v is the speed of the wave, and the observation wave can be handled with an average wavelength $\lambda_0$.

Provided on the output sides of the scanning sensor 213 and the fixed sensor 214 are pre-conversion units 215 and 216 which pass only components of a predetermined frequency band of the observation signals b(t) and a(t) from the scanning sensor 211 and the fixed sensor 214 so as to convert them into signals of an intermediate frequency IF, respectively. A reference frequency $f_{ref}$ is supplied to the pre-conversion units 215 and 216. The pre-conversion units 215 and 216 can be realized by causing, for example, an RF spectrum analyzer to be phase locked to the reference frequency $f_{ref}$ in a zero span mode. Where a sound wave or a radiowave of a comparatively low frequency is used as the observation wave, a pre-conversion unit which performs band limitation and frequency conversion by digital signal processing may be used. Data memories 218 and 219 which sample and store outputs of the pre-conversion units 215 and 216 are disposed on the output sides of the pre-conversion units 215 and 216, respectively. A trigger circuit 217 which generates a trigger signal in response to an external synchronization input or an output of the pre-conversion unit 215 is provided so that the data memories 218 and 219 can start sampling of data in response to the trigger signal. Further, a sampling frequency $f_S$ is supplied to the data memories 218 and 219.

A Fourier transform unit 220 performs Fourier transform of data sampled by and stored in the data memories 218 and 219 to calculate spectra $S_a(\omega)$ and $S_b(\omega)$, respectively. Provided on the output side of the Fourier transform unit 220 is an average value calculation unit 221 which calculates an average value of power spectra of the spectra $S_a(\omega)$ and $S_b(\omega)$ and an average value of a cross spectrum of the spectra $S_a(\omega)$ and $S_b(\omega)$. An angular frequency is represented as $\omega$. The wave source image visualization apparatus further includes a first arithmetic unit 222 for calculating a coherence function $Y^2(\omega)$ based on a result of calculation by the average value calculation unit 221, and a second arithmetic unit 223 for calculating a correlation value $C_{ab}(x, y)$ based on an integration operation function $f(\omega)$ determined from the coherence function $Y^2(\omega)$ and the result of calculation by the average value calculation unit 221. More further, a wave source image reconstruction processing unit 224 for reconstructing a wave source image based on the correlation value $C_{ab}$, and a display unit 225 for displaying the reconstructed wave source image are provided.

The first arithmetic unit 222 and the second arithmetic unit 223 correspond to the coherence function calculation means and the correlation value calculation means, respectively. As hereinafter described, since the reconstruction method of a wave source image is different depending upon the relationship between the distance z and the wavelength $\lambda_0$ of the observation wave, also the distance z is inputted to the wave source image reconstruction processing unit 224. The trigger circuit 217, data memories 218 and 219 and Fourier transform unit 220 described above can be implemented, for example, using an FFT spectrum analyzer (digital spectrum analyzer).

Subsequently, visualization of a wave source image using this apparatus will be described.

As the scanning sensor 213 is moved, a wave from the observation object 211 is received at an arbitrary point (x, y) in the scanning observation plane 212 to obtain a signal b(t), and simultaneously, the wave is received also by the fixed sensor 214 to obtain another signal a(t). And, after the signals b(t) and a(t) are limited to a predetermined frequency band, they are converted in frequency into signals of the intermediate frequency IF by the pre-conversion units 215 and 216, respectively, and those signals are sampled for a period of T seconds at a sampling rate sufficiently higher than the observation frequency bandwidth by the data memories 218 and 219, respectively. Then, the thus sampled data are Fourier transformed by the Fourier transform unit 220 to obtain a spectrum $S_a(\omega)$ corresponding to the signal a(t) and another spectrum $S_b(\omega)$ corresponding to the signal b(t). The spectra $S_a(\omega)$ and $S_b(\omega)$ are inputted to the average value calculation unit 221, by which average values $<|S_a(\omega)|>$ and $<|S_b(\omega)|>$ of power spectra of the spectra $S_a(\omega)$ and $S_b(\omega)$ and a power spectrum $<S_a^*(\omega)S_b(\omega)>$ of a cross spectrum between the spectra $S_a(\omega)$ and $S_b(\omega)$ are calculated. Here, <·> represents an ensemble average.

The first arithmetic unit 222 calculates a coherence function $Y^2(\omega)$ in the predetermined observation frequency band based on equation (8) below making use of a result of calculation by the average value calculation unit 221.

$$\gamma^2(\omega) = \frac{|<S_a{}^*(\omega)S_b(\omega)>|^2}{<|S_a{}^*(\omega)|^2><|S_b(\omega)|^2>} \tag{8}$$

Then, by setting a threshold value α for the coherence function $Y^2(\omega)$, an integration operation function f(ω) is obtained as indicated by equation (9) below.

$$f(\omega) = \begin{cases} 1 & (\gamma^2(\omega) > \alpha) \\ 0 & (\gamma^2(\omega) \leq \alpha) \end{cases} \tag{9}$$

The second arithmetic unit 223 calculates a complex correlation value $C_{ab}(x, y)$ normalized with $|S_a(\omega)|$ for each position (x, y) of the scanning sensor 213 on the scanning observation plane 212 based on equation (10) below. Here, $\omega_0$ represents a center angular frequency of the observation frequency band.

$$C_{ab}(x,y) = \int_{\omega_0 - (\Delta\omega/2)}^{\omega_0 + (\Delta\omega/2)} \frac{<S_a{}^*(\omega)S_b(\omega;x,y)>}{<|S_a(\omega)|>} f(\omega)d\omega \tag{10}$$

This correlation value $C_{ab}(x, y)$ is a value corresponding to a cross-correlation between the signal $S_a(t)$ and the signal $S_b(t)$ when the delay time τ is 0. In this instance, the coherence function $Y^2(\omega)$ used to obtain the integration operation function f(ω) may be updated to a new value each time the scanning sensor 213 is moved, or a value obtained at a representative point $(x_0, y_0)$ on the scanning observation plane 212 may be used as a common value of the coherence function $Y^2(\omega)$ at other points. Further, upon the calculation of the correlation value $C_{ab}(x, y)$, the cross spectrum and the square root of the power spectrum of the signal a(t) may be used without performing an averaging operation. In contrast, for calculation of the coherence function $Y^2(\omega)$, an averaged cross spectrum and an averaged power spectrum square root must be used without fail.

After the correlation value $C_{ab}(x, y)$ is calculated at different points on the scanning observation plane 212, a wave source image is reconstructed based on the thus calculated correlation values by the wave source image reconstruction processing unit 224 and is displayed on the display unit 225, for example, in a birds-eye view representation. The reconstruction of a wave source image is performed by three methods including observation in a neighboring field region, observation in a Fresnel region and observation in a Fraunhofer region in accordance with the distance z between the observation object 211 and the scanning observation plane 212.

In the observation in the neighboring region represented by a case wherein the distance z is much smaller than the average wavelength $\lambda_0$ of the observation wave (z<<$\lambda_0$), the correlation value $C_{ab}(x, y)$ is displayed as it is.

In the observation in the Fresnel region which is a region intermediate between the neighboring field region and the Fraunhofer region, $$F^{-1}[F[C_{ab}(x, y)] \cdot F[P(x, y; z)]] \tag{11}$$

is displayed, where F[·] represents Fourier transform, $F^{-1}[\cdot]$ represents reverse Fourier transform, and P(x, y; z) is represented by the following equation:

$$P(x,y;z) = \exp[jk_0(x^2+y^2)/2] \tag{12}$$

Meanwhile, in the observation in the Fraunhofer region represented by z>>$\lambda_0$, display is performed in accordance with a value represented by $$\iint C_{ab}(x,y)\exp[-jk_0(\xi x+\eta y)]dxdy \tag{13}$$

where $k_0=2\pi/\lambda_0$, and ξ and η are an azimuth and an angle of elevation as viewed from the scanning observation plane 212, respectively, and ξ=x'/z, η=y'/z.

The amplitude value reconstructed in this manner provides an absolute average amplitude value within the range of $\omega_0+(\Delta\omega/2)$ irrespective of the spatial coherency of the wave source. Actually, it is desirable to determine the distance z in accordance with the relationship between the magnitude of the observation object 211 and the average wavelength $\lambda_0$ of the observation wave. In particular, when the average wavelength $\lambda_0$ is larger than the observation area, the distance z is set to z<$\lambda_0$ so that observation may be performed in the neighboring field region. On the other hand, when the area of the observation object 211 is larger than the area of the scanning observation plane 212, the distance z is set to z>>$\lambda_0$ so that observation in the Fraunhofer region may be performed, but when they have an intermediate relationship to each other, the distance z is set so that observation may be performed in the Fresnel region.

As the display unit 225 displays an amplitude and a phase at each reconstruction position simultaneously, spatial and temporal coherences of the wave source can be recognized. When observation is performed while varying the trigger conditions for obtaining observation data, the manner of variation of the amplitude for each trigger condition indicates a time coherency while the manner of variation of the phase indicates a space coherency. Simultaneous display of the amplitude and the phase can be effected, where, for example, birds-eye view display is employed, by representing the amplitude with the height of a mountain and representing the phase with a color or the brightness. Or, the amplitude and the phase may be represented two-dimensionally with the amplitude represented by the brightness and with the phase represented by a color, or else a contour map may be employed such that the amplitude is represented by a contour line and the phase is represented by a color or the brightness.

Here, constraints to visualization of a wave source image in the present embodiment will be described. The observation frequency bandwidth Δω must be so that, where the distance between the observation object 211 and an observation position is represented by r, the phase looks substantially fixed with respect to a frequency variation within the bandwidth Δω at the distance r. Further, in order to effect evaluation with the coherence function $Y^2(\omega)$, it is necessary that a same signal component be received by the scanning sensor 213 and the fixed sensor 214, and the sampling time T be sufficiently larger than the difference between the delay time on the scanning sensor 213 side and the delay time on the fixed sensor 214 side and besides the spectrum $S_a(\omega)$ from the scanning sensor 213 and the spectrum $S_b(\omega)$ from the fixed sensor 214 be recognized in a spectrum region by a frequency resolution which depends upon the sampling time T.

From the viewpoints described above, in order to set the sampling frequency $f_S$ as low as possible, the bandwidth of band limitation with the pre-conversion units 215 and 216 and the observation frequency bandwidth Δω should be set equal to each other. However, it is a common practice to use a band-pass filter based on an analog circuit for band limitation, and there is the possibility that the band-pass filters of the pre-conversion units 215 and 216 may have different characteristics. Therefore, the bandwidth of the band-pass filters should be set larger than the observation frequency bandwidth Δω while the observation frequency band is set at a portion of the frequency characteristic of the band-pass filters which is proximate to a comparatively ideal characteristic.

As described above, in the wave source image visualization method of the present invention, a distribution of a partially coherent wave source can be evaluated without the necessity for beforehand knowledge of a coherency, and the method can follow up a rapid variation of a spectrum.

It is to be noted that the wave source image visualization method of the present invention is not limited to measurement which is performed while a single scanning sensor is moved in a scanning observation plane. For example, a plurality of fixed sensors may be arranged two dimensionally in a scanning observation plane so that an observation wave may be received at a time by those sensors. In this instance, one of the two-dimensionally arranged sensors may be used as the fixed sensor described hereinabove, or received signals from several ones of the sensors may be added to obtain the signal a(t) described above, which corresponds to a signal from the fixed sensor.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A correlation function measurement method for measuring a correlation function between a first observation signal and a second observation signal in a predetermined observation frequency band, comprising the steps of:

limiting the first observation signal to the observation frequency band to perform a frequency conversion of the first observation signal into a signal of a first frequency;

limiting the second observation signal to the observation frequency band to perform a frequency conversion of the second observation signal, based on a reference frequency signal same as that used upon the frequency conversion to the first frequency, to a signal of a second frequency having a predetermined frequency difference from the first frequency; and multiplying the signal of the first frequency and the signal of the second frequency and performing vector detection, based on the reference frequency signal, for a difference frequency component between the two signals.

2. The correlation function measurement method according to claim 1, wherein the vector detection is performed by producing, by synthesized Fourier integration, a reference signal corresponding to the frequency difference based on the reference frequency signal.

3. The correlation function measurement method according to claim 2, wherein phase information obtained by the vector detection is divided by an observation frequency to determine a delay time between the first observation signal and the second observation signal.

4. A correlation function measurement method for measuring a correlation function between a first observation signal and a second observation signal in a predetermined observation frequency band, comprising the steps of:

limiting the first observation signal to the observation frequency band to perform a frequency conversion of the first observation signal into a signal of a predetermined intermediate frequency;

limiting the second observation signal to the observation frequency band to perform a frequency conversion of the second observation signal, based on a reference frequency signal same as that used upon the frequency conversion to the first frequency, to a signal of the intermediate frequency;

performing frequency conversion, based on the reference frequency signal, for at least one of the first observation signal and the second observation signal after the conversion into the intermediate frequency to cause a predetermined frequency difference to be produced between the first observation signal and the second observation signal; and multiplying the first observation signal and the second observation signal which have the frequency difference produced therebetween and performing vector detection, based on the reference frequency signal, for a difference frequency component produced by the multiplication between the two signals.

5. The correlation function measurement method according to claim 4, wherein the vector detection is performed by producing, by synthesized Fourier integration, a reference signal corresponding to the frequency difference based on the reference frequency signal.

6. The correlation function measurement method according to claim 5, wherein phase information obtained by the vector detection is divided by an observation frequency to determine a delay time between the first observation signal and the second observation signal.

7. A correlation function measurement apparatus for measuring a correlation function between a first observation signal and a second observation signal in a predetermined observation frequency band, comprising:

first conversion means for limiting the first observation signal to the observation frequency band and performing a frequency conversion of the first observation signal into a signal of a predetermined intermediate frequency;

second conversion means for limiting the second observation signal to the observation frequency band and performing a frequency conversion of the second observation signal to a signal of the intermediate frequency based on a reference frequency signal same as that used by said first conversion means;

a multiplier for multiplying the signal supplied from said first conversion means and the signal supplied from said second conversion means;

a mixer interposed between an output of at least one of said first conversion means and said second conversion means, and said multiplier;

a local oscillator provided for each mixer for supplying a local oscillation signal phase-locked to the reference frequency signal to the mixer so that a predetermined frequency difference may be produced between the two signals to be inputted to said multiplier; and a vector detector for performing vector detection for a difference frequency component of the output of said multiplier based on the reference frequency signal.

8. The correlation function measurement apparatus according to claim 7, wherein said vector detector is a synthesized Fourier integration vector detector which produces a reference signal corresponding to the frequency difference from the reference frequency signal to perform vector detection.

9. A wave source image visualization method wherein two-dimensional interference measurement is performed for a radiation wave from an observation object to visualize a wave source image of the observation object, comprising the steps of:

detecting the radiation wave at a position which makes a reference to an observation plane of the two-dimensional interference measurement to output a first signal;

detecting the radiation wave at an arbitrary position in said observation plane to output a second signal;

Performing Fourier transform of the first signal and the second signal to obtain a first spectrum and a second spectrum, respectively;

detecting a power spectrum of the first spectrum, a power spectrum of the second spectrum and a cross-spectrum between the first spectrum and the second spectrum;

determining a coherence function based on an average value of the cross-spectrum and average values calculated from the power spectra;

obtaining the cross-spectrum for each point in said observation plane, normalizing the cross-spectrum with a square root of the power spectrum of the first spectrum and performing integration calculation for the normalized cross-spectrum in accordance with a value of the coherence function in an observation frequency band to calculate a correlation value; and selecting an operation processing method for reconstruction of the wave source image in accordance with a distance between the observation object and said observation plane and reconstructing the wave source image based on the correlation value at each of the points.

10. The wave source image visualization method according to claim 9, wherein, upon calculation of the correlation value, the integration calculation is performed within a frequency range within which the value of the coherence function is higher than a predetermined threshold value.

11. The wave source image visualization method according to claim 10, wherein phase information and amplitude information of the reconstructed wave source image are displayed simultaneously.

12. The wave source image visualization method according to claim 11, wherein the measurement is performed with different trigger conditions and phase information and amplitude information are compared to evaluate temporal and spatial coherences.

13. The wave source image visualization method according to claim 9, wherein, when the distance between the observation object and said observation plane is much smaller than an average wavelength of the observation wave, the correlation values at the individual points are displayed as a wave source image.

14. A wave source image visualization apparatus wherein two-dimensional interference measurement is performed for a radiation wave from an observation object to visualize a wave source image of the observation object, comprising:

a first sensor for detecting the radiation wave at a position which makes a reference to an observation plane of the two-dimensional interference measurement and outputting the detected radiation wave as a first signal;

a second sensor for detecting the radiation wave at an arbitrary position in said observation plane and outputting the detected radiation wave as a second signal;

Fourier transform means for performing Fourier transform of the first signal and the second signal to calculate a first spectrum and a second spectrum, respectively;

average value calculation means for calculating an average value of a power spectrum of the first spectrum, an average value of a power spectrum of the second spectrum and an average value of a cross-spectrum between the first spectrum and the second spectrum;

coherence function calculation means for determining a coherence function based on the average value of the cross-spectrum and the average values calculated from the power spectra;

correlation value calculation means for obtaining the cross-spectrum for each point in said observation plane, normalizing the cross-spectrum with a square root of the power spectrum of the first spectrum and performing integration calculation for the normalized cross-spectrum in accordance with a value of the coherence function in an observation frequency band to calculate a correlation value; and wave source image reconstruction processing means for selecting operation processing for reconstruction of the wave source image in accordance with a distance between the observation object and said observation plane and reconstructing the wave source image based on the correlation value at each of the points.

15. The wave source image visualization apparatus according to claim 14, further comprising a first data memory for accumulating the first signal and outputting the accumulated first signal to said Fourier transform means, a second data memory for accumulating the second signal and outputting the accumulated second signal to said Fourier transform means, and a trigger circuit for generating a trigger signal for data storage to said first data memory and said second data memory.

16. The wave source image visualization apparatus according to claim 15, further comprising display means for displaying phase information and amplitude information of the wave source image reconstructed by said wave form image reconstruction processing means simultaneously.

* * * * *